United States Patent
Hsu et al.

(10) Patent No.: US 6,859,370 B1
(45) Date of Patent: Feb. 22, 2005

(54) BOARD TO BOARD ARRAY TYPE CONNECTOR

(75) Inventors: Chien-Yu Hsu, Taoyuan Hsien (TW); Yen-Jang Liao, Taoyuan Hsien (TW); Li-Sen Chen, Taoyuan Hsien (TW)

(73) Assignee: Speed Tech Corp., Taoyuan Hsien (TW)

( * ) Notice: Subject to any disclaimer, the term of this patent is extended or adjusted under 35 U.S.C. 154(b) by 0 days.

(21) Appl. No.: 10/654,044

(22) Filed: Sep. 4, 2003

(51) Int. Cl.[7] .................. H05K 7/12; H01R 12/00; H01R 12/06
(52) U.S. Cl. .............. 361/752; 361/796; 361/735; 361/728; 361/736; 439/65; 439/66; 439/74; 439/75
(58) Field of Search ................. 361/728, 730, 361/735, 736, 742, 752, 758, 770, 790, 796, 804, 807, 808; 439/65, 66, 71, 75, 68, 526

(56) References Cited

U.S. PATENT DOCUMENTS

| | | | | |
|---|---|---|---|---|
| 3,786,168 A | * | 1/1974 | Jaecklin et al. | 174/16.3 |
| 4,159,483 A | * | 6/1979 | Bettin | 257/727 |
| 5,215,472 A | * | 6/1993 | DelPrete et al. | 439/71 |
| 5,221,209 A | * | 6/1993 | D'Amico | 439/71 |
| 5,594,356 A | * | 1/1997 | Turner et al. | 324/755 |
| 5,713,744 A | * | 2/1998 | Laub | 439/71 |
| 5,730,620 A | * | 3/1998 | Chan et al. | 439/526 |
| 5,793,618 A | * | 8/1998 | Chan et al. | 361/809 |
| 5,978,223 A | * | 11/1999 | Hamilton et al. | 361/704 |
| 6,181,567 B1 | * | 1/2001 | Roemer et al. | 361/760 |
| 6,337,228 B1 | * | 1/2002 | Juskey et al. | 438/122 |
| 6,400,577 B1 | * | 6/2002 | Goodwin et al. | 361/816 |
| 6,477,058 B1 | * | 11/2002 | Luebs et al. | 361/784 |
| 6,485,311 B2 | * | 11/2002 | Torok et al. | 439/73 |
| 6,497,582 B1 | * | 12/2002 | Hoffmeyer | 439/71 |
| 6,529,023 B2 | * | 3/2003 | Becker et al. | 324/754 |
| 6,545,879 B1 | * | 4/2003 | Goodwin | 361/807 |
| 6,549,418 B1 | * | 4/2003 | Deeney | 361/736 |
| 6,603,665 B1 | * | 8/2003 | Truong et al. | 361/752 |
| 6,680,848 B2 | * | 1/2004 | Petit et al. | 361/704 |

\* cited by examiner

Primary Examiner—Kamand Cuneo
Assistant Examiner—Dameon E. Levi
(74) Attorney, Agent, or Firm—Rabin & Berdo, P.C.

(57) ABSTRACT

A board to board array type connector comprising an array type connector, an upper supporting cover, a lower supporting cover, a screw with a bolt and a screw nut; during application, the upper supporting cover is on the top of the upper PCB, the upper pressing area/point presses down on the top of the upper PCB, the lower supporting cover is on the bottom of the lower PCB, the lower pressing area/point presses up on the bottom of the lower PCB; the screw with bolt passes through all the through holes and is fastened with the screw nut on the end to assemble the whole set, the stress is distributed equilibrium to the upper and lower pressing area/point, the pressure is evenly over all the connection pins of the array type connector for better electrical conductivity.

11 Claims, 3 Drawing Sheets

BOARD TO BOARD ARRAY TYPE CONNECTOR

BACKGROUND OF THE INVENTION

I. Field of the Invention

This invention relates generally to an array type connector and, more specifically, to a board to board array type connector that connects a lower PCB and a upper board, the structure and fastening method is simple, the pins on he connector have evenly stress for better connectivity, the pins also have very good shield effect of electro-magnetic interference (EMI).

II. Description of the Prior Art

Heretofore, it is known that the fastening structure of an array type connector, as shown in FIG. 3 is an example, a microprocessor (a) connects to a lower PCB (c) through an array type connector (b); the fastening method is to have a heat sink (d) stick to top of the microprocessor (c), then have four screws (e) pass through heat sink (d) and array type connector (b) and fasten with the fastening board (f) beneath the lower PCB (c).

Based on above known structure, this method needs four screws (e) to lock, the process is tedious and consumes manpower, when the locking strength of four screws are different, the pressure on different area of the connector (b) will be different, such might causes bad connection condition or even causes twist on the surface of lower PCB that further introduces circuitry and component damage and/or short situation.

SUMMARY OF THE INVENTION

It is therefore a primary object of the invention to provide a board to board array type connector with a simple structure and assembly method to have the upper and lower pressing area/point of the upper supporting cover and the lower supporting cover stress even pressure over lower PCB, array type connector and upper PCB for better electrical conductivity and lower cost.

It is an objective of this invention to provide a board to board array type connector in which the top and the bottom the connector pins of the array type connector are wrapped with metal for better shielding effect against electromagnetic interference (EMI).

It is still an objective of this invention to provide a board to board array type connector in which the thickness of the upper and lower pressing area/point to the center through hole of the upper supporting cover and the lower supporting cover is thinner than that of the upper and lower pressing area/point to make the upper supporting cover and the lower supporting cover more elasticity to prevent loose condition when the screws with bolts are screwed tight.

In order to achieve the objective set forth, a board to board array type connector in accordance with the present invention comprises a an array type connector, an upper supporting cover, a lower supporting cover, a screw with a bolt and a screw nut; a center through hole each is on the center of the upper supporting cover and the lower supporting cover, several upper and lower pressing area/point surround the center through holes, the thickness in center area is thinner than that of the area near the upper and lower pressing area/point; a through hole corresponding to the upper and lower supporting covers is on the center of the array type connector.

Based on above description, the upper supporting cover is on the top of the upper PCB, the upper pressing area/point presses down on the top of the upper PCB, the lower supporting cover is on the bottom of the lower PCB, the lower pressing area/point presses up on the bottom of the lower PCB, the screw with bolt passes through all the through holes and is fastened with the screw nut on the end to assemble the whole set, such structure can make the stress distributed equilibrium to the upper and lower pressing area/point, the pressure is evenly over all the connection pins of the array type connector for better electrical conductivity. The thinner center of the upper and lower supporting covers design can make the upper and lower supporting covers more elasticity to prevent loose condition when the screw with bolt is screwed tight. The upper and lower supporting covers are made of conductivity material and connected to ground better shielding effect against electromagnetic interference (EMI).

BRIEF DESCRIPTION OF THE DRAWINGS

The accomplishment of the above-mentioned object of the present invention will become apparent from the following description and its accompanying drawings which disclose illustrative an embodiment of the present invention, and are as follows.

DESCRIPTION OF THE PREFERRED EMBODIMENT

Figure 1:
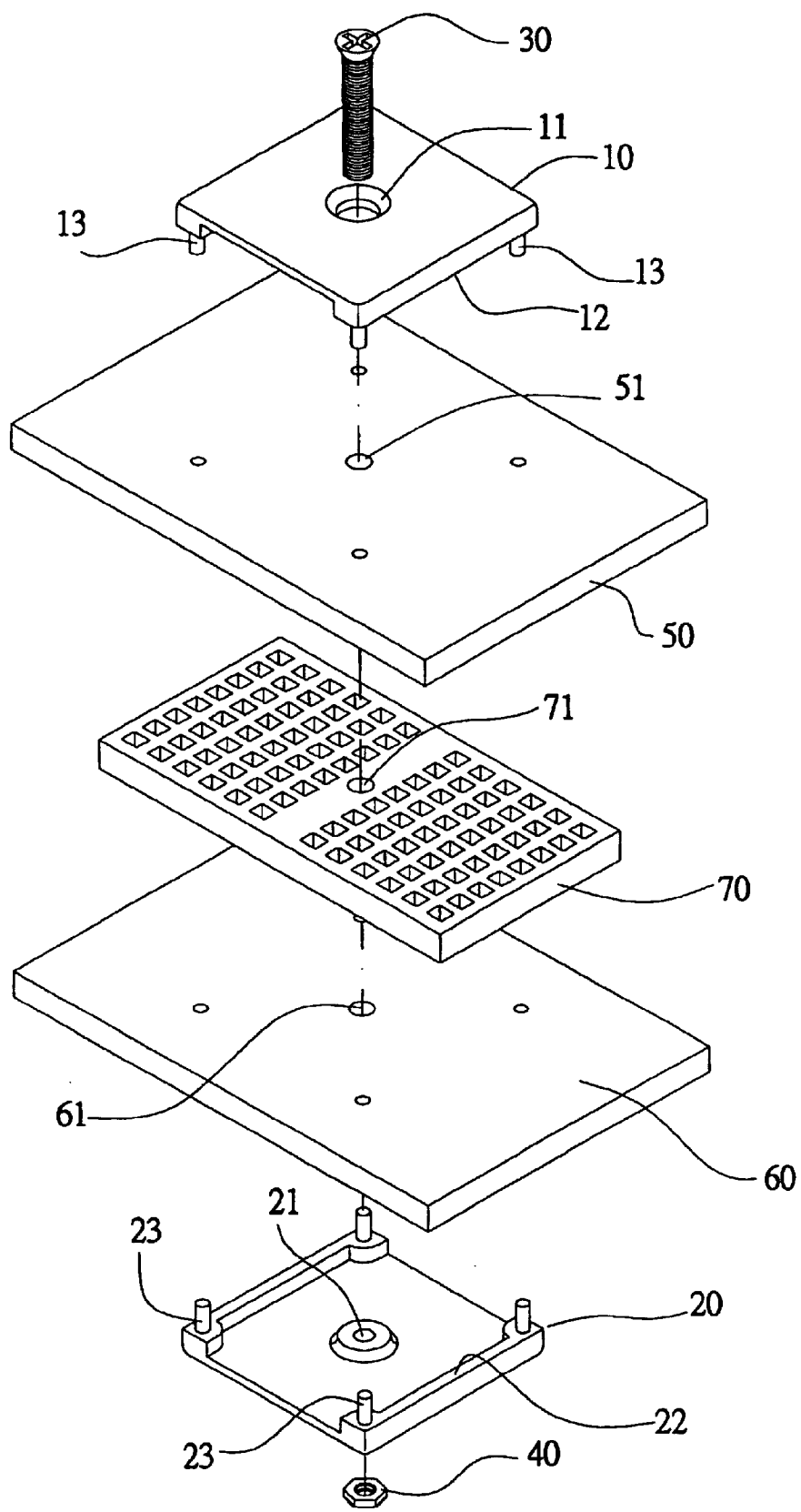
FIG. 1 is an assembly view of the present invention.
Figure 2:
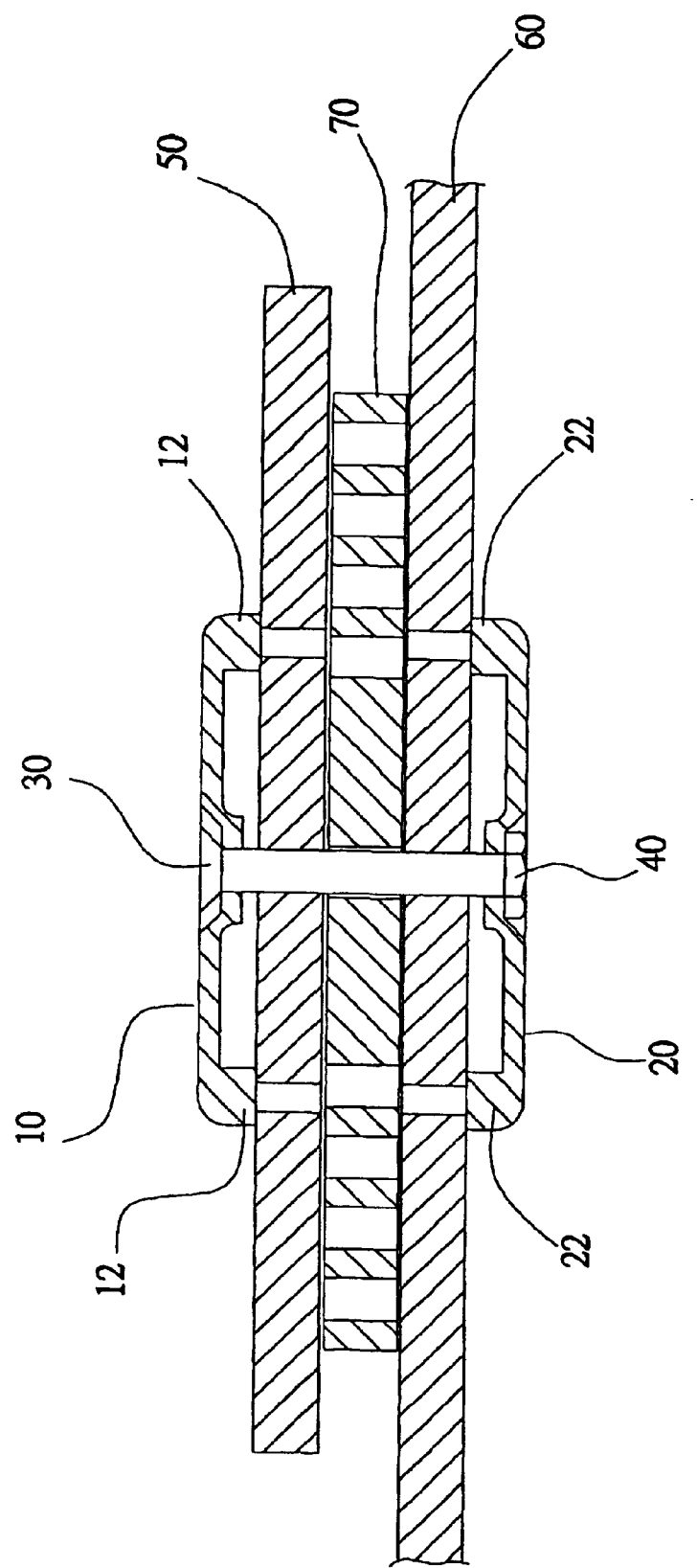
FIG. 2 is a cross-sectional view of the present invention.
Figure 3:
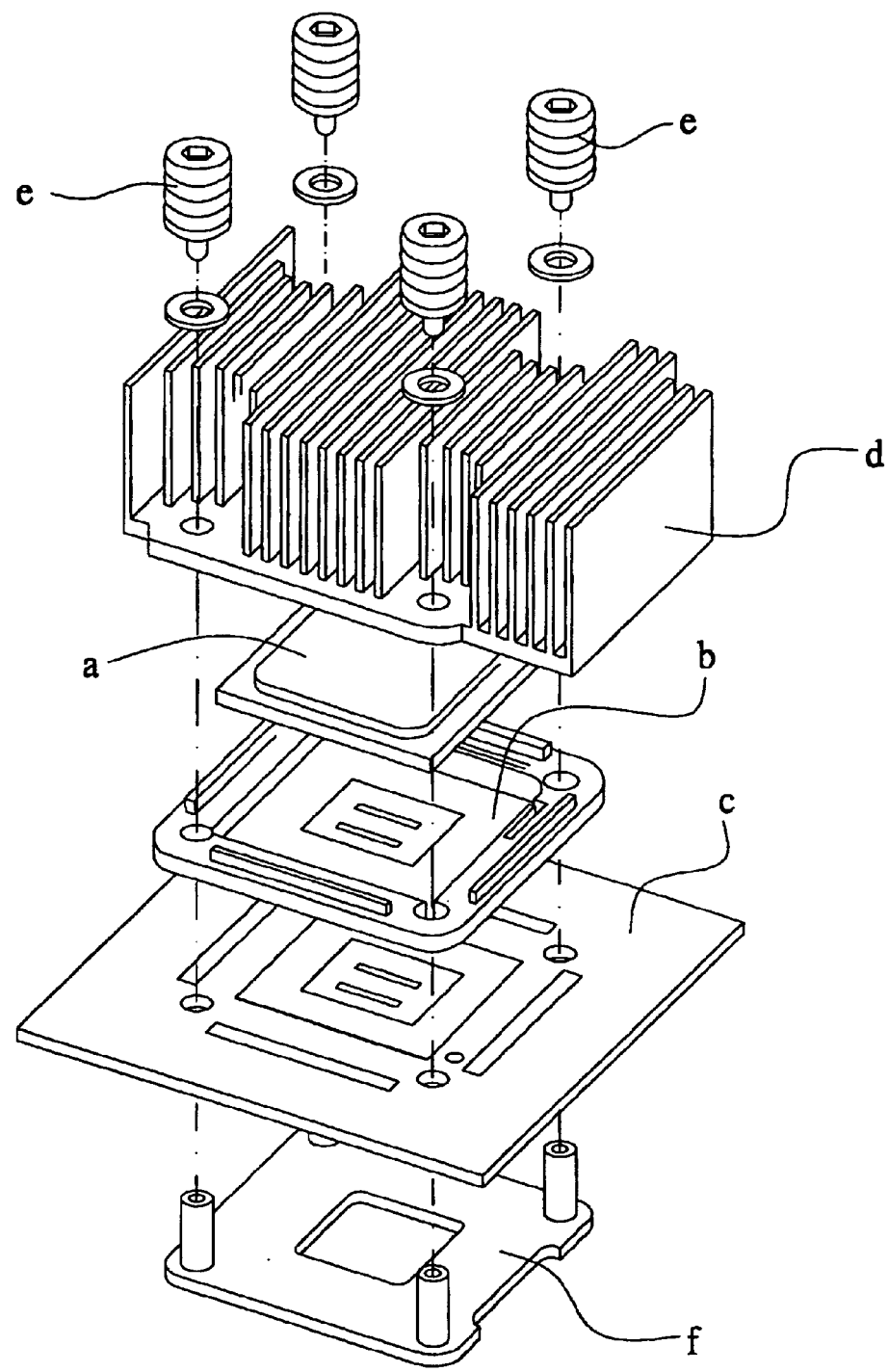
FIG. 3 is an assembly view of the prior art.

Referring to FIG. 1 and FIG. 2, the present invention is composed of an array type connector (70), an upper supporting cover (10), a lower supporting cover (20), a screw with a bolt (30) and a screw nut (40); the major feature is a center through hole (11), (21) each is on the center of the upper supporting cover (10) and the lower supporting cover (20), several upper and lower pressing area/point (12) and (22) surround the center through hole (11), (21).

Based on above structure, the upper supporting cover (10) and the lower supporting cover (20) apply four positioning pole (13), (23) on four corners to install on the lower PCB (60) and the upper PCB (50) respectively and accurately; the upper supporting cover (10) is on the top of the upper PCB (50), the upper pressing area/point (12) presses down on the top of the upper PCB (50); the lower supporting cover (20) is on the bottom of the lower PCB (60), the lower pressing area/point (22) presses up on the bottom of the lower PCB (60). The array connector (70) is clamped between the upper PCB (50) and the lower PCB (60), one through hole (61), (71) and (51) each corresponding to the location of the center through hole (11), (21) is on the lower PCB (60), the array connector (70) and the upper PCB (50) respectively; the screw with bolt (30) passes through all the through hole (11,21,51,61,71) and is fastened with the screw nut (40) on the end to assemble the whole set rapidly.

As seen in the drawing, the center through hole 11 is located at the center of the upper supporting cover 10 and is centrally located among the upwardly pressing area/points 12; and the center through hole 21 is located at the center of the lower supporting cover 20 and is centrally located among the upwardly pressing area/points 22. The drawing also shows that there is exactly one through hole 11, 21 located at the center of each of the upper supporting cover 10 and the lower supporting cover 20, and that those holes are substantially equidistant from the respective pressing area/points 12, 22.

Based on above description, the locking strength of the screw with bolt (30) and the screw nut (40) can be spread evenly to the upper and lower pressing area point (12) and (22) by the strength and the elastic function of the upper supporting cover (10) and the lower supporting cover (20), such scheme achieves equilibrium pressure over the lower PCB (60), the array connector (70) and the upper PCB (50) for better electrical connection effect.

The upper supporting cover (10) and the lower supporting cover (20) are made from conductivity material, the upper supporting cover (10) and the lower supporting cover (20) are connected to ground, based on above structure, the upper supporting cover (10) and the lower supporting cover (20) can shield those naked connector pins from electromagnetic interference. The present invention achieves equilibrium pressure over all the pins, also offers less components for easier material control and lower cost effect.

The lower supporting cover (20) and the screw nut (40) can be combined into one component to reduce the number of components and cost.

The thickness of the upper and lower pressing area point (12) and (22) to the center through hole (11), (21) of the upper supporting cover (10) and the lower supporting cover (20) is thinner than that of the upper and lower pressing area/point (12) and (22); when the screw with bolt (30) is screwed tight, the center of the upper supporting cover (10) and the lower supporting cover (20) will be depressed, such structure offers evenly distribution of stress to all area of the upper supporting cover (10) and the lower supporting cover (20). The upper and lower pressing area/point (12) and (22) of the upper supporting cover (10) and the lower supporting cover (20) can be in single row, double rows, or in rectangular or circular shape.

While a preferred embodiment of the invention has been shown and described in detail, it will be readily understood and appreciated that numerous omissions, changes and additions may be made without departing from the spirit and scope of the invention.

What is claimed is:

1. A board to board array type connector comprising:

(a) an upper PCB and a lower PCB;

(b) an array type connector clamped between the upper PCB and the lower PCB;

(c) an upper supporting cover and a lower supporting cover, each further comprising at least one respective through hole, said lower supporting cover being disposed on the top of the upper PCB and comprising at least one downwardly pressing area/point that presses down on the the top of the upper PCB, said lower supporting cover being disposed on the bottom of the lower PCB and comprising at least one upwardly pressing area/point that presses up on the bottom of the lower PCB;

wherein the lower PCB, the upper PCB, and said array connector each includes a respective additional through hole alignable with the respective through hole of each of said upper supporting cover and said lower supporting cover; and (d) a screw passing through all of said through holes in said upper supporting cover, said lower supporting cover, said lower PCB, said upper PCB, and said array connector, and being fastened with a screw nut on the end of said screw.

2. The board to board array type connector recited in claim 1, wherein said lower supporting cover and said screw nut are combined into one component.

3. The board to board array type connector recited in claim 1, wherein the thickness of said upper supporting cover and said lower supporting cover, from said upwardly and downwardly pressing area/points to the center through hole of said upper supporting cover and said lower supporting cover, is thinner than that of said upwardly and downwardly pressing area/points, to make said upper supporting cover and said lower supporting cover more elastic to prevent looseness when said screw with bolt is screwed tight.

4. The board to board array type connector recited in claim 1, wherein said upper supporting cover and said lower supporting cover are made of conductivity material.

5. The board to board array type connector recited in claim 4, wherein said upper supporting cover and said lower supporting cover connect to ground for better electromagnetic interference shielding effect.

6. The board to board array type connector recited in claim 1, wherein each respective through hole is a center through hole, and comprising a plurality of the upwardly pressing area/points disposed to surround the center through hole of said lower supporting cover, and a plurality of the downwardly pressing area/points disposed to surround the center through hole of said upper supporting cover.

7. The board to board array type connector recited in claim 6, wherein the respective through hole located at the center of said upper supporting cover is centrally located among the downwardly pressing area/points, and the respective through hole located at the center of said lower supporting cover is centrally located among the upwardly pressing area/points.

8. The board to board array type connector recited in claim 6, comprising exactly one respective through hole located at the center of each of said upper supporting cover and said lower supporting cover.

9. The board to board array type connector recited in claim 8, wherein the respective through hole located at the center of said upper supporting cover is substantially equidistant from all of the downwardly pressing area/points, and the respective through hole located at the center of said lower supporting cover is substantially equidistant from all of the upwardly pressing area/points.

10. The board to board array type connector recited in claim 1, comprising exactly one respective through hole located at the center of each of said upper supporting cover and said lower supporting cover.

11. The board to board array type connector recited in claim 1, comprising positioning poles on at least one of the upper supporting cover and the lower supporting cover, whereby the positioning poles are fittable to the upper PCB or the lower PCB.

* * * * *